US012684291B2

(12) United States Patent　　　　(10) Patent No.:　US 12,684,291 B2
Jiang et al.　　　　　　　　　　　　(45) Date of Patent:　Jul. 14, 2026

(54) PROTECTION METHOD AND SYSTEM, AND COMPUTER-READABLE STORAGE MEDIUM

(71) Applicant: AAC Technologies (Nanjing) Co., Ltd., Nanjing (CN)

(72) Inventors: Yuheng Jiang, Nanjing (CN); Lijian Ye, Nanjing (CN); Kejia Liu, Nanjing (CN); Ruizhi Lan, Nanjing (CN); Hongling Fu, Nanjing (CN)

(73) Assignee: AAG Technologies (Nanjing) Co., Ltd., Nanjing (CN)

( * ) Notice: Subject to any disclaimer, the term of this patent is extended or adjusted under 35 U.S.C. 154(b) by 177 days.

(21) Appl. No.: 18/406,257

(22) Filed: Jan. 8, 2024

(65) Prior Publication Data

US 2024/0340582 A1　　Oct. 10, 2024

Related U.S. Application Data

(63) Continuation of application No. PCT/CN2023/086208, filed on Apr. 4, 2023.

(51) Int. Cl.
| | |
|---|---|
| *H04R 3/00* | (2006.01) |
| *H03F 3/20* | (2006.01) |
| *H03G 1/00* | (2006.01) |
| *H04R 1/24* | (2006.01) |

(52) U.S. Cl.
CPC .............. *H04R 3/007* (2013.01); *H03F 3/20* (2013.01); *H03G 1/0005* (2013.01); *H04R 1/24* (2013.01); *H03F 2200/03* (2013.01)

(58) Field of Classification Search
CPC ...... H04R 3/007; H04R 2460/03; H04R 1/24; H03F 3/20; H03F 2200/03; H03G 1/0005
USPC ............................................................ 381/55
See application file for complete search history.

(56) References Cited

FOREIGN PATENT DOCUMENTS

CN　　　　115884056　　*　3/2023

* cited by examiner

*Primary Examiner* — Norman Yu
(74) *Attorney, Agent, or Firm* — Wiersch Law Group

(57) ABSTRACT

A coaxial speaker tweeter temperature protection method, a coaxial speaker tweeter temperature protection system, and a computer-readable storage medium are provided. The coaxial speaker tweeter temperature protection method is applied to a coaxial speaker including a tweeter and a woofer, including steps of acquiring a woofer real-time temperature, performing calculation on the woofer real-time temperature and a pre-processed input signal through a tweeter temperature prediction algorithm to predict a tweeter real-time temperature in a current state, where the pre-processed input signal is a signal acquired after processing a sound effect algorithm on an input audio signal, etc. Compared with the related art, the coaxial speaker tweeter temperature protection method, the coaxial speaker tweeter temperature protection system, the electronic device, and the computer-readable storage medium provide better temperature protection for the tweeter, reliability of which is better.

3 Claims, 2 Drawing Sheets

Acquiring a woofer real-time temperature　　　　　　— S1

Performing calculation on the woofer real-time temperature and a pre-processed input signal through a tweeter temperature prediction algorithm to predict a tweeter real-time temperature in a current state, where the pre-processed input signal is a signal obtained after processing a sound effect algorithm on an input audio signal　　— S2

Performing the calculation on the tweeter real-time temperature and the pre-processed input signal through a tweeter temperature protection algorithm to determine that whether the tweeter real-time temperature is higher than a predetermined temperature threshold; if the tweeter real-time temperature is higher than the predetermined temperature threshold, performing power suppression on the pre-processed input signal and then outputting the pre-processed input signal　　— S3

PROTECTION METHOD AND SYSTEM, AND COMPUTER-READABLE STORAGE MEDIUM

TECHNICAL FIELD

The present disclosure relates to coaxial speakers, and in particular to a speaker tweeter temperature protection method, a coaxial speaker tweeter temperature protection system, and a computer-readable storage medium.

BACKGROUND

Speakers are indispensable components for mobile terminals, in particular, coaxial speakers are recently a novel high-end speaker in a field of consumer electronics. The coaxial speakers each includes two speaker units, one of the two speaker units is a woofer configured to generate low-frequency signals, and another one the two speaker units is a tweeter configured to generate intermediate-frequency signals and high-frequency signals, the two speaker units form an integral structure through structural design. Currently, a driving solution of the coaxial speaker is as shown in FIG. 1, where a capacitor is connected at an input end of the tweeter, the capacitor and the tweeter are connected to the woofer in parallel, and the tweeter and the woofer are finally connected to an output end of an intelligent power amplifier. In a working process of one coaxial speaker, if input, such as voltage peak, power, etc., is too large, an amplitude and a temperature of the coaxial speaker may be exceeded, and other risks may exist. In some situations, abnormal sound may be generated, so far as to damage devices in some serious situations. Temperature protection is important for protecting the coaxial speaker, the temperature protection adjusts input signals through a protection algorithm when the temperature of the coaxial is too high, so that the coaxial speaker may not be damaged due to the too high temperature.

However, in the related art, a coaxial speaker temperature detection method acquires a real-time temperature of a voice coil through superimposing a signal with small amplitude and low frequency, such as 15 Hz, acquiring a direct-current resistance through low-frequency response, and then performing conversion through a temperature model. For detecting low-frequency signals, since there is the capacitor, a branch circuit where the tweeter is located is similar to be broken, a resistance of the woofer is detected, so that a temperature of the woofer is acquired. A tweeter protection method is to input a first audio signal after processing through a sound effect algorithm to a tweeter temperature protection algorithm for processing to acquire a second audio signal, the tweeter temperature protection algorithm performs calculation and analysis according to the second audio signal, if the first audio signal is determined to be under a current input, such as current voltage peak, current power, etc., there is a risk that the coaxial speaker is too high in temperature, so that the first audio signal is processed through the tweeter temperature protection algorithm first and then input to the coaxial speaker; if there is no related risk, the first audio signal is not needed to process and is directly input to the coaxial speaker. However, the risk is mainly that that the real-time temperature of the voice coil cannot be fed back and corrected, that is, there is no feedback link, and prediction precision is limited.

Therefore, it is necessary to provide a coaxial speaker tweeter temperature protection method, a coaxial speaker tweeter temperature protection system, an electronic device, and a computer-readable storage medium to solve above technical problems.

SUMMARY

The present disclosure aims to provide a coaxial speaker tweeter temperature protection method, a coaxial speaker tweeter temperature protection system, an electronic device, and a computer-readable storage medium, using a woofer temperature to predict a tweeter temperature, to provide better temperature protection for a tweeter.

In order to achieve above aims, in a first aspect, the present disclosure provides a coaxial speaker tweeter temperature protection method, applied to a coaxial speaker including a tweeter configured to generate intermediate-frequency (IF) signals and high-frequency signals and a woofer configured to generate low-frequency signals, including:

acquiring a woofer real-time temperature;

performing calculation on the woofer real-time temperature and a pre-processed input signal through a tweeter temperature prediction algorithm to predict a tweeter real-time temperature in a current state, where the pre-processed input signal is a signal acquired after processing a sound effect algorithm on an input audio signal;

performing the calculation on the tweeter real-time temperature and the pre-processed input signal through a tweeter temperature protection algorithm to determine that whether the tweeter real-time temperature is higher than a predetermined temperature threshold; and if the tweeter real-time temperature is higher than the predetermined temperature threshold, performing power suppression on the pre-processed input signal and then outputting the pre-processed input signal to the tweeter.

The tweeter and the woofer are coaxially disposed.

As an improvement, the tweeter temperature prediction algorithm is a corresponding tweeter temperature model.

In a second aspect, the present disclosure further provides a coaxial speaker tweeter temperature protection system applied to a coaxial speaker including a tweeter configured to generate intermediate-frequency (IF) signals and high-frequency signals and a woofer configured to generate low-frequency signals. The tweeter and the woofer are coaxially disposed. An input end of the tweeter is connected to an output end of a power amplifier after being connected to a capacitor in series, an input end of the woofer is connected to the output end of the power amplifier. The coaxial speaker tweeter temperature protection system includes a sound effect algorithm module, a temperature acquisition module, a tweeter temperature prediction module, and a tweeter temperature protection module. The sound effect algorithm module is configured to perform a sound effect algorithm on an input audio signal to acquire a pre-processed input signal. The temperature acquisition module is configured to acquire a woofer real-time temperature according to I/V feedback of the power amplifier. The tweeter temperature prediction module is configured to receive the woofer real-time temperature and a pre-processed input signal, and perform calculation on the woofer real-time temperature and the pre-processed input signal through a tweeter temperature prediction algorithm to predict a tweeter real-time temperature in a current state. The tweeter temperature protection module is configured to perform the calculation on the tweeter real-time temperature and the pre-processed input signal through a tweeter temperature protection algorithm to determine that whether the tweeter real-time temperature is higher than a predetermined temperature threshold. If the tweeter real-time temperature is higher than the predetermined temperature threshold, power suppression is performed on the pre-processed input signal and then the pre-processed input signal is output to the tweeter.

In a third aspect, the present disclosure provides a computer-readable storage medium, the computer-readable storage medium includes a tweeter temperature protection program, and the tweeter temperature protection program is executed by a processor to execute the coaxial speaker tweeter temperature protection method as foregoing.

Compared with the related art, according to the coaxial speaker tweeter temperature protection method, the coaxial speaker tweeter temperature protection system, and the computer-readable storage medium of the present disclosure, the input audio signal is processed through the sound effect algorithm to acquire the pre-processed input signal, and the woofer real-time temperature is acquired, then the calculation is performed on the woofer real-time temperature and the pre-processed input signal through the tweeter temperature protection algorithm to determine that whether the tweeter real-time temperature is higher than a predetermined temperature threshold, so as to provide temperature protection for the tweeter. That is, feedback prediction is performed on unknown variable, such as the tweeter real-time temperature, through processing known information, such as the woofer real-time temperature, so that the prediction precision is higher through feedback ink, and reliability of the temperature protection for the tweeter is better.

BRIEF DESCRIPTION OF DRAWINGS

In order to more clearly illustrate embodiments of the present disclosure or technical solutions in the related art, drawings that need to be used in the embodiments or the related art are briefly described below, and it is obvious that the accompanying drawings in following description are merely some embodiments of the present disclosure, and those who skilled in the art may obtain other drawings according to these drawings without involving any inventive effort.

DETAILED DESCRIPTION

Technical solutions in embodiments of the present disclosure are clearly and completely described below with reference to accompanying drawings in the embodiments of the present disclosure. All other embodiments obtained by those who skilled in the art based on the embodiments of the present disclosure without creative efforts shall fall within a protection scope of the present disclosure.

First Embodiment

Figure 1:
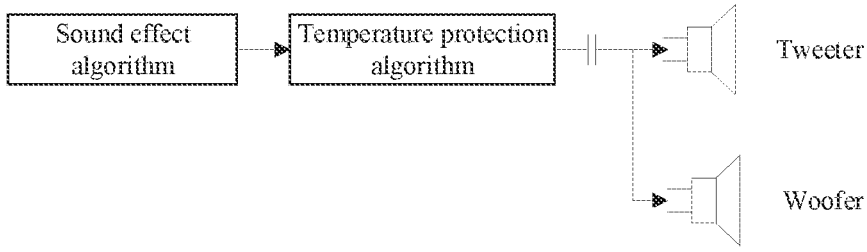
FIG. 1 is a structural block diagram of a coaxial speaker tweeter temperature protection system in the related art.
Figure 2:
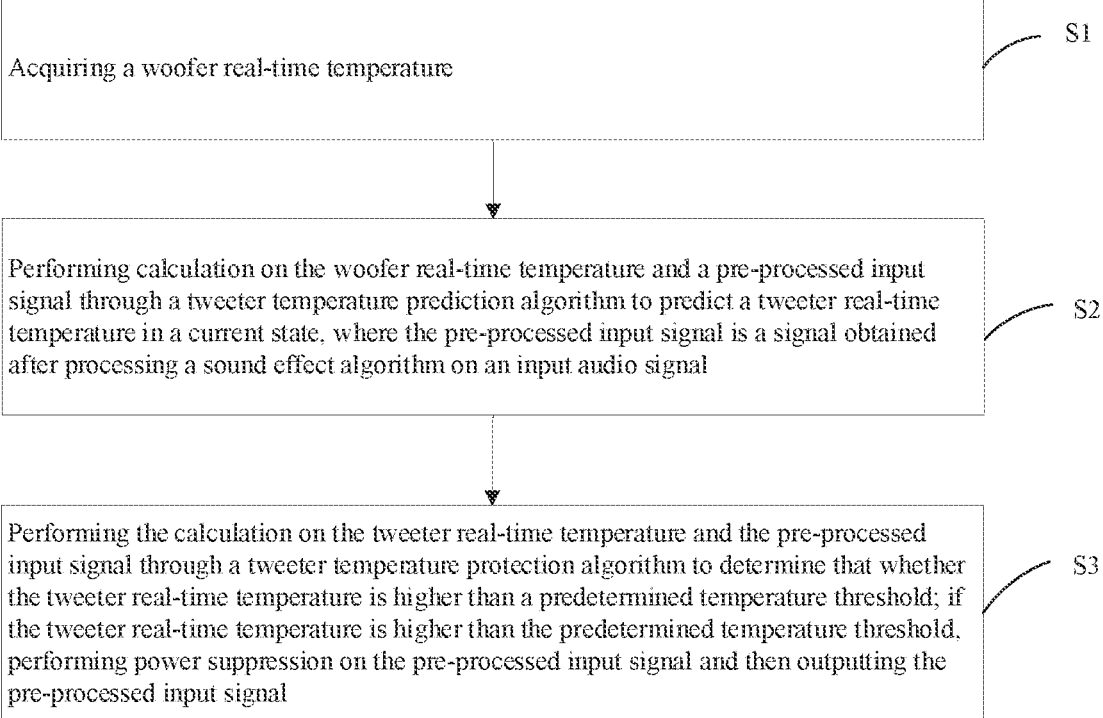
FIG. 2 is a flowchart of a coaxial speaker tweeter temperature protection method according to one embodiment of the present disclosure.

Please refer to FIG. 2, the first embodiment of the present disclosure provides a coaxial speaker tweeter temperature protection method, applied to a coaxial speaker including a tweeter configured to generate intermediate-frequency (IF) signals and high-frequency signals and a woofer configured to generate low-frequency signals. The tweeter and the woofer are coaxially disposed. The coaxial speaker tweeter temperature protection method includes following steps.

Step S1: acquiring a woofer real-time temperature.

In the step S1, a method for acquiring the woofer real-time temperature is the same as that in the related art, but is not limited to the description of the present embodiment.

For example, a speaker is served as a woofer, a temperature rise coefficient corresponding to a voice coil of the speaker is provided by a supplier and is a known parameter, the temperature rise coefficient refers to a corresponding relationship between a change amount of a temperature of the voice coil and a change rate of a direct-current (DC) resistance of the voice coil since changing of the temperature of the voice coil enables the DC resistance to change, where the temperature of the voice coil rises, the DC resistance of the voice coil increases. In general, the corresponding relationship is as following: (resistance change/original resistance)/temperature change=constant, and the constant generally refers to as a temperature rise coefficient. First, the DC resistance at a normal temperature, such as 25° C., is calibrated, a single-frequency signal with small amplitude and low frequency, such as 15 Hz, is superimposed in the input audio signal, voltage and current information at both ends of the coaxial speaker is acquired through the power amplifier, and a current DC resistance is acquired after data processing, and current temperature information of the voice coil of the speaker, i.e. the woofer real-time temperature, is acquired according to the temperature rise coefficient and the DC resistance at normal temperature.

Step S2: performing calculation on the woofer real-time temperature and a pre-processed input signal through a tweeter temperature prediction algorithm to predict a tweeter real-time temperature in a current state, where the pre-processed input signal is a signal obtained after processing a sound effect algorithm on an input audio signal.

In the step S2, the tweeter temperature prediction algorithm is a corresponding tweeter temperature model. That is, a real-time temperature of the voice coil of the tweeter, i.e. the speaker, is converted by a temperature model.

Step S3: performing the calculation on the tweeter real-time temperature and the pre-processed input signal through a tweeter temperature protection algorithm to determine that whether the tweeter real-time temperature is higher than a predetermined temperature threshold; if the tweeter real-time temperature is higher than the predetermined temperature threshold, performing power suppression on the pre-processed input signal and then outputting the pre-processed input signal to the tweeter. For example, a voltage magnitude and/or a current magnitude of the pre-processed input signal is suppressed to adjust the pre-processed input signal, so that the real-time temperature of the voice coil of the tweeter, i.e. the speaker, is controlled to be within a threshold range, the tweeter may not be damaged due to too high temperature.

If the tweeter real-time temperature is lower than the predetermined temperature threshold, the input audio signal has no need to be performed with the power suppression, so that the input audio signal is directly input to the tweeter.

Compared with the related art, according to the coaxial speaker tweeter temperature protection method of the present disclosure, the input audio signal is processed through the sound effect algorithm to acquire the pre-processed input signal, and the woofer real-time temperature is acquired, then the calculation is performed on the woofer real-time temperature and the pre-processed input signal through the tweeter temperature protection algorithm to determine that whether the tweeter real-time temperature is higher than a predetermined temperature threshold, so as to provide temperature protection for the tweeter. That is, feedback prediction is performed on unknown variable, such as the tweeter real-time temperature, through processing known information, such as the woofer real-time temperature, so that the prediction precision is higher through feedback ink, and reliability of the temperature protection for the tweeter is better.

Second Embodiment

Figure 3:
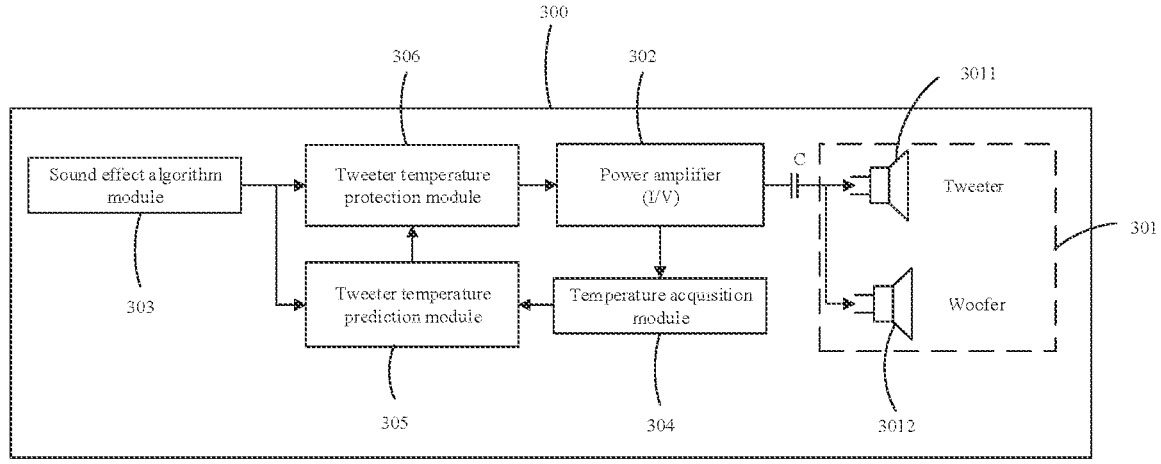
FIG. 3 is a structural block diagram of a coaxial speaker tweeter temperature protection system according to one embodiment of the present disclosure.

As shown in FIG. 3, the second embodiment of the present disclosure further provides a coaxial speaker tweeter temperature protection system 300 applied to a coaxial speaker 301 including a tweeter 3011 configured to generate intermediate-frequency (IF) signals and high-frequency signals and a woofer 3012 configured to generate low-frequency signals. The tweeter 3011 and the woofer 3012 are coaxially disposed.

An input end of the tweeter 3011 is connected to an output end of a power amplifier 302 after being connected to a capacitor C in series, an input end of the woofer 3012 is connected to the output end of the power amplifier 302.

The coaxial speaker tweeter temperature protection system 300 includes a sound effect algorithm module 303, a temperature acquisition module 304, a tweeter temperature prediction module 305, and a tweeter temperature protection module 306

The sound effect algorithm module 303 is configured to perform a sound effect algorithm on an input audio signal to acquire a pre-processed input signal.

The temperature acquisition module 304 is configured to acquire a woofer real-time temperature according to I/V feedback of the power amplifier.

The tweeter temperature prediction module 305 is configured to receive the woofer real-time temperature and a pre-processed input signal, and perform calculation on the woofer real-time temperature and the pre-processed input signal through a tweeter temperature prediction algorithm to predict a tweeter real-time temperature in a current state.

The tweeter temperature prediction algorithm is a corresponding tweeter temperature model. That is, a real-time temperature of a voice coil of the tweeter, i.e. a speaker, is converted by a temperature model.

The tweeter temperature protection module 306 is configured to perform the calculation on the tweeter real-time temperature and the pre-processed input signal through a tweeter temperature protection algorithm to determine that whether the tweeter real-time temperature is higher than a predetermined temperature threshold.

If the tweeter real-time temperature is higher than the predetermined temperature threshold, power suppression is performed on the pre-processed input signal and then the pre-processed input signal is output to the tweeter 3011. For example, a voltage magnitude and/or a current magnitude of the pre-processed input signal is suppressed to adjust the pre-processed input signal, so that the real-time temperature of the voice coil of the tweeter, i.e. the speaker, is controlled to be within a threshold range, the tweeter may not be damaged due to too high temperature, and the power suppression is mainly achieved through controlling the power amplifier 302.

If the tweeter real-time temperature is lower than the predetermined temperature threshold, the input audio signal has no need to be performed with the power suppression, so that the input audio signal is directly input to the tweeter 3011.

In the embodiment, a technical effect achieved by the coaxial speaker tweeter temperature protection system 300 is the same as the technical effect and principle achieved by the coaxial speaker tweeter temperature protection provided as foregoing, and details of which are not described herein again.

Third Embodiment

Figure 4:
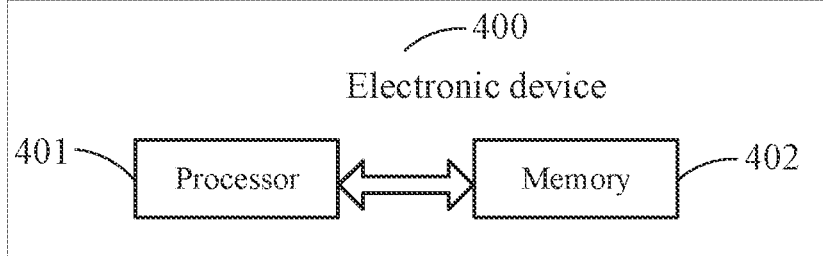
FIG. 4 is a structural block diagram of an electronic device according to one embodiment of the present disclosure.

As shown in FIG. 4, the third embodiment of the present disclosure provides an electronic device 400, including a processor 401, a memory 402, and a tweeter temperature protection program. The tweeter temperature protection program is stored in the memory 402, the processor 401 is configured to execute the tweeter temperature protection program. The processor 401 executes the tweeter temperature protection program to execute a coaxial speaker tweeter temperature protection method. The coaxial speaker tweeter temperature protection method includes following steps.

Step S1: acquiring a woofer real-time temperature.

In the step S1, a method for acquiring the woofer real-time temperature is the same as that in the related art, but is not limited to the description of the present embodiment.

For example, a speaker is served as a woofer, a temperature rise coefficient corresponding to a voice coil of the speaker is provided by a supplier and is a known parameter, the temperature rise coefficient refers to a corresponding relationship between a change amount of a temperature of the voice coil and a change rate of a direct-current (DC) resistance of the voice coil since changing of the temperature of the voice coil enables the DC resistance to change, where the temperature of the voice coil rises, the DC resistance of the voice coil increases. In general, the corresponding relationship is as following: (resistance change/original resistance)/temperature change=constant, and the constant generally refers to as a temperature rise coefficient. First, the DC resistance at a normal temperature, such as 25° C., is calibrated, a single-frequency signal with small amplitude and low frequency, such as 15 Hz, is superimposed in the input audio signal, voltage and current information at both ends of the coaxial speaker is acquired through the power amplifier, and a current DC resistance is acquired after data processing, and current temperature information of the voice coil of the speaker, i.e. the woofer real-time temperature, is acquired according to the temperature rise coefficient and the DC resistance at normal temperature.

Step S2: performing calculation on the woofer real-time temperature and a pre-processed input signal through a tweeter temperature prediction algorithm to predict a tweeter real-time temperature in a current state, where the pre-processed input signal is a signal obtained after processing a sound effect algorithm on an input audio signal.

In the step S2, the tweeter temperature prediction algorithm is a corresponding tweeter temperature model. That is, a real-time temperature of the voice coil of the tweeter, i.e. the speaker, is converted by a temperature model.

Step S3: performing the calculation on the tweeter real-time temperature and the pre-processed input signal through a tweeter temperature protection algorithm to determine that whether the tweeter real-time temperature is higher than a predetermined temperature threshold.

If the tweeter real-time temperature is higher than the predetermined temperature threshold, performing power suppression on the pre-processed input signal and then outputting the pre-processed input signal to the tweeter. For example, a voltage magnitude and/or a current magnitude of the pre-processed input signal is suppressed to adjust the pre-processed input signal, so that the real-time temperature of the voice coil of the tweeter, i.e. the speaker, is controlled to be within a threshold range, the tweeter may not be damaged due to too high temperature.

If the tweeter real-time temperature is lower than the predetermined temperature threshold, the input audio signal has no need to be performed with the power suppression, so that the input audio signal is directly input to the tweeter.

It should be noted that, when the electronic device 400 is used, the electronic device 400 may achieve the technical effect achieved by the coaxial speaker tweeter temperature protection method provided in the first embodiment, please refer to the technical effect achieved by the coaxial speaker tweeter temperature protection method, details of which are not described herein again.

Fourth Embodiment

The fourth embodiment further provides a computer-readable storage medium, the computer-readable storage medium includes a tweeter temperature protection program, and the tweeter temperature protection program is executed by a processor to execute the coaxial speaker tweeter temperature protection method as foregoing, so that a technical effect achieved by the computer-readable storage medium is the same as the technical effect achieved by the coaxial speaker tweeter temperature protection method as foregoing, details of which are not described herein again.

The foregoing is merely embodiments of the present disclosure, and it should be noted that, for those who skilled in the art, improvements may be made without departing from a concept of the present disclosure, but these are all within a protection scope of the present disclosure.

What is claimed is:

1. A coaxial speaker tweeter temperature protection method, applied to a coaxial speaker comprising a tweeter configured to generate intermediate-frequency (IF) signals and high-frequency signals and a woofer configured to generate low-frequency signals where the tweeter and the woofer are coaxially disposed, comprising:

acquiring a woofer real-time temperature;

performing calculation on the woofer real-time temperature and a pre-processed input signal through a tweeter temperature prediction algorithm to predict a tweeter real-time temperature in a current state, where the pre-processed input signal is a signal acquired after processing a sound effect algorithm on an input audio signal;

performing the calculation on the tweeter real-time temperature and the pre-processed input signal through a tweeter temperature protection algorithm to determine that whether the tweeter real-time temperature is higher than a predetermined temperature threshold; and if the tweeter real-time temperature is higher than the predetermined temperature threshold, performing power suppression on the pre-processed input signal and then outputting the pre-processed input signal to the tweeter;

wherein the tweeter and the woofer are coaxially disposed.

2. The coaxial speaker tweeter temperature protection method according to claim 1, wherein the tweeter temperature prediction algorithm is a corresponding tweeter temperature model.

3. A coaxial speaker tweeter temperature protection system, applied to a coaxial speaker comprising a tweeter configured to generate intermediate-frequency (IF) signals and high-frequency signals and a woofer configured to generate low-frequency signals, comprising:

a sound effect algorithm module;

a temperature acquisition module;

a tweeter temperature prediction module; and a tweeter temperature protection module;

wherein the tweeter and the woofer are coaxially disposed, an input end of the tweeter is connected to an output end of a power amplifier after being connected to a capacitor in series, an input end of the woofer is connected to the output end of the power amplifier; the sound effect algorithm module is configured to perform a sound effect algorithm on an input audio signal to acquire a pre-processed input signal; the temperature acquisition module is configured to acquire a woofer real-time temperature according to I/V feedback of the power amplifier; the tweeter temperature prediction module is configured to receive the woofer real-time temperature and a pre-processed input signal, and perform calculation on the woofer real-time temperature and the pre-processed input signal through a tweeter temperature prediction algorithm to predict a tweeter real-time temperature in a current state; the tweeter temperature protection module is configured to perform the calculation on the tweeter real-time temperature and the pre-processed input signal through a tweeter temperature protection algorithm to determine that whether the tweeter real-time temperature is higher than a predetermined temperature threshold; if the tweeter real-time temperature is higher than the predetermined temperature threshold, power suppression is performed on the pre-processed input signal and then the pre-processed input signal is output to the tweeter.

* * * * *